United States Patent [19]
Peacock

[11] Patent Number: 6,030,230
[45] Date of Patent: Feb. 29, 2000

[54] DIVIDER FOR PCI CARD CONCURRENT MAINTENANCE

[75] Inventor: James Larry Peacock, Rochester, Minn.

[73] Assignee: International Business Machines Corporation, Armonk, N.Y.

[21] Appl. No.: 09/104,669

[22] Filed: Jun. 25, 1998

[51] Int. Cl.[7] .............................. H01R 9/09; H05K 1/00
[52] U.S. Cl. ............................................................ 439/61
[58] Field of Search .................... 439/64, 61; 361/728, 361/736, 741, 801, 802, 684, 686, 785, 788, 800

[56] References Cited

U.S. PATENT DOCUMENTS

| | | | |
|---|---|---|---|
| 5,469,335 | 11/1995 | Kluth et al. | 361/800 |
| 5,603,618 | 2/1997 | Hayakawa et al. | 439/64 |
| 5,815,377 | 9/1998 | Lund et al. | 361/802 |
| 5,848,906 | 12/1998 | Glusker et al. | 439/157 |
| 5,909,359 | 6/1999 | Summers et al. | 361/748 |

OTHER PUBLICATIONS

Photograph of Compaq with Dividers, 1998.

*Primary Examiner*—Neil Abrams
*Assistant Examiner*—Hae Moon Hyeon
*Attorney, Agent, or Firm*—Christopher H. Lynt

[57] ABSTRACT

A divider for preventing a card device from contacting another card device or other electrical component includes a planar member, and locating and securing features which serve to locate the planar member with respect to a card connector, a card planer board, and to locate and secure a card device with respect to the divider.

27 Claims, 6 Drawing Sheets

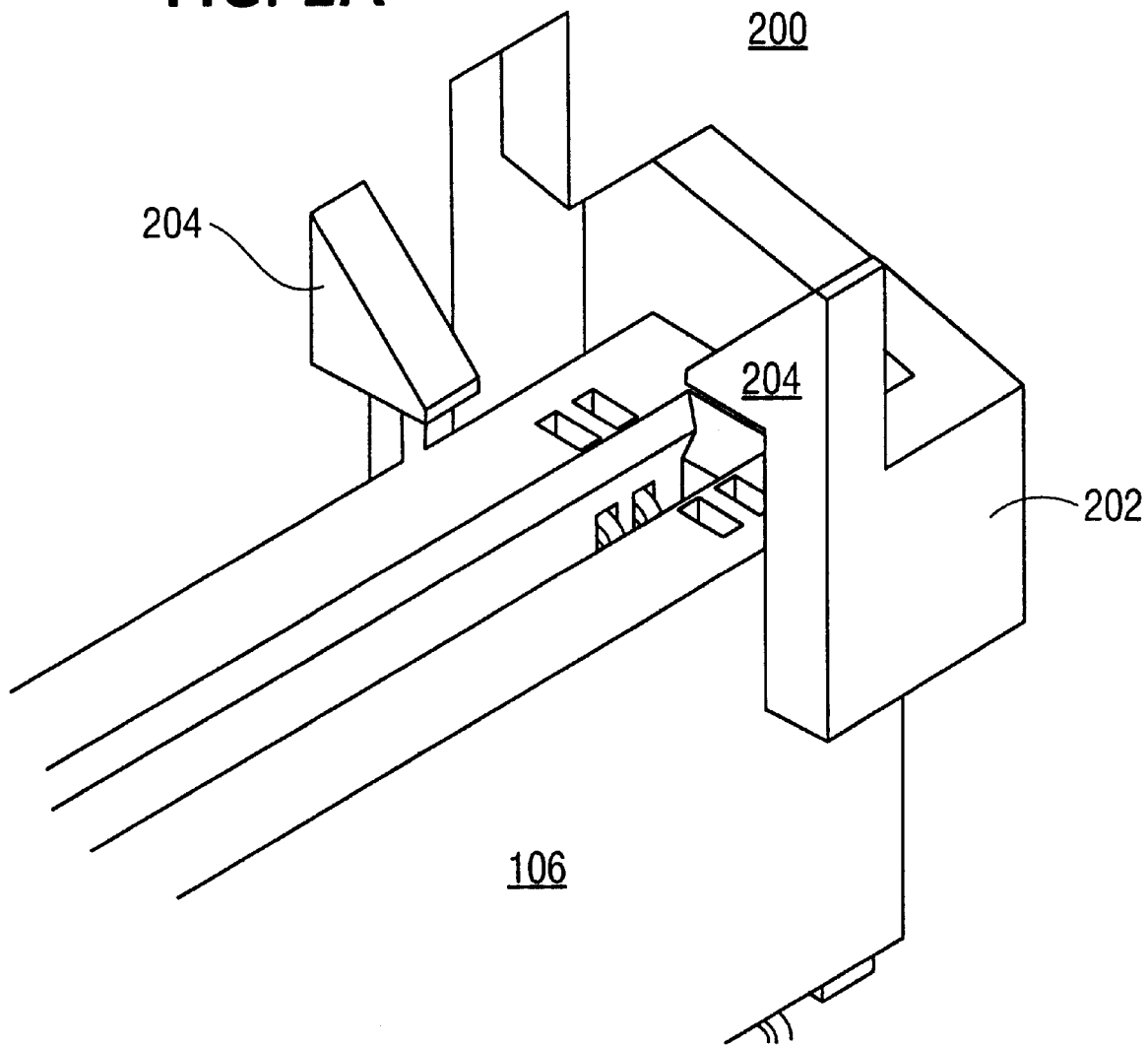

DIVIDER FOR PCI CARD CONCURRENT MAINTENANCE

BACKGROUND OF THE INVENTION

Field of The Invention

The invention relates to the field of electronic circuit component cards having edge connectors for mating with corresponding slot connectors, such as peripheral component interconnect (PCI) cards which are pluggable into PCI slot connectors disposed on computer motherboards and backplanes, for example, and in particular to concurrent maintenance and hot-plugging of PCI circuit cards.

Background Information

There are a variety of standard bus types and associated slot connectors currently in use in computer systems, including the currently popular PCI (Peripheral Component Interconnect), for example. There are also a number of corresponding electronic circuit component cards, also referred to as electronic cards or card devices herein, having card edge connectors for mating with the slot connectors on personal computer (PC) system motherboards and/or backplanes, for example.

The card edge connectors have a number of relatively closely spaced metal contacts on one or both sides of the card edge, and the corresponding slots similarly have a like number of closely spaced metal contacts therein. When the card edge connector is inserted in the slot connector, the corresponding contacts make electrical connection. Through these contacts and their electrical connection, the card device and the personal computer system communicate data, address and control signals, for example. The card device also generally obtains electrical energy from the personal computer system through two or more of the contacts.

The card edge connectors have a predefined size and, in the case of PCI cards, for example, have key slots which align with corresponding key ridges provided within the slot connectors. These keyed features, as well as the fact that the slots of the slot connectors are closed at ends thereof, help to ensure that the card edge connector contacts align with the correct slot connector contacts when fully inserted. However, these card devices have been designed with the assumption that they will be inserted by hand by the personal computer owner or technician. During insertion by hand, it is possible that there could be a momentary contact with an adjacent card or other nearby component, or there could be a momentary misalignment of the closely spaced edge contacts, causing a short circuit, for example. (It should be noted that the providing of the keyed features generally adequately prevents any contact misalignment during insertion.) Because of this, such cards are generally installed with the personal computer system turned off, i.e., "powered down."

The following discussion relates to PCI-based card devices, however, the same factors addressed may hold true for other types of card devices. The PCI bus is a synchronous, processor independent, 32- or 64-bit bus that functions similarly to a processor local bus. The PCI bus can be thought of as a buffered intermediate or so-called mezzanine bus, that is, an extension of the processor local bus. It is coupled to the personal computer processor local bus by so-called "bridge" circuitry, but maintains its own separate set of circuits. The original PCI bus specification required a constant speed of 33 MHz, which translates to a transfer rate of 80–120 Mbs in a 32-bit environment, and up to a 264 Mbs transfer rate in a 64-bit environment. The PCI bus operates on 5 volts, 3.3 volts, or both.

PCI and the other so-called local bus technologies, e.g., VESA (Video Electronics Standard Association), were developed to permit personal computers to communicate more quickly with peripheral devices, particularly video cards in the case of VESA where the "V" stands for video. Graphic operating systems and applications, for example, place a high throughput demand on a bus system. The original IBM PC (IBM is a registered trademark of International Business Machine Corporation) had a bus speed of about 1 megabyte per second, the IBM AT about 4 megabytes per second, a typical ISA bus about 8 megabytes to a maximum of 16 megabytes per second, the EISA bus has 32 megabytes per second, the MCA bus 20–40 megabytes per second, the VESA VL-1 has 20–132 megabytes per second, the VESA VL-2 up to 264 megabytes per second, the PCI 1.0 has 80–120 megabytes per second and the PCI 2.0 up to 264 megabytes per second. The VESA and PCI buses are called "local bus" technologies because the motherboard bus is bypassed, and the peripheral connected to the processor "local" bus, through the VESA circuitry or the PCI bridge circuitry. This permits peripherals to be run at the full CPU clock speed, over the full CPU 32- or 64-bit data path, with readily apparent benefits.

As mentioned, the PCI standard bus was also developed as a way to integrate peripherals in general onto personal computer motherboards. PCI buses have gained favor over other buses due in part to the fewer control lines used. A PCI bus uses 32 conductors to carry both the address and data lines, while a VESA VL-1 bus, for example, uses up to 64 (32 data and 32 address). This permits PCI cards to be, in general, smaller than other types of local bus cards.

For these reasons, and others, PCI buses, cards and card slots have become widespread in the personal computer (PC) market, and there are now a plethora of PCI-based card devices available. Until recently, personal computer buses and card devices, e.g., PCI buses and card devices, have not been used in mid-range to high-end, e.g., "mainframe," computer systems. Therefore, until recently, only the personal computer user has had the advantage of the wide range of available peripheral component interconnect (PCI) card devices, and the like. However, as personal computers and their peripherals have reached higher and higher performance levels, and have become more and more varied, their integration into mid-range to high-end computer systems has been given serious consideration. It has now been recognized that the users of mid-range to high-end computer systems could benefit from the variety, versatility and availability of PCI card devices, and the like.

Therefore, mid-range and high-end computer systems are now being shipped with PCI card devices. One example of a mid-range computer is the IBM AS/400 series (AS/400 is a registered trademark of International Business Machine Corporation).

While providing a PCI bus and card connector on a mid-range to high-end computer system motherboard or backplane, for example, to meet the above-identified need may seem to be relatively straight forward, and admittedly, can be accomplished with sufficient effort, there are a number of related technical issues which have to be addressed in doing so. One of these issues relates to common differences in the way personal computers and mid-range to high-end computers are put to use, as will be explained.

As mentioned, PCI and similar electronic card devices generally derive power from the personal computer motherboard or backplane through the card slot they are plugged into. Further, it is generally assumed in the design of the cards that they will be plugged in by hand when the power to the personal computer is off, to avoid the possibility of damage to components on the cards and/or motherboard, should there be a momentary contact with an adjacent card or component, or a misalignment of the closely spaced contacts, during insertion causing a short circuit or connection of power to the wrong contact, for example, as mentioned earlier.

This requirement that power be off during insertion and/or extraction of the card is inconvenient but generally tolerable when the card devices are used in the typical desktop personal computer. Because PCI and other types of card devices designed for personal computers were not designed to be able to be plugged in while the computer system is powered up, until now, their use in high-end and mid-range computer systems could have undesirable consequences.

In mid-range to high-end systems, uninterrupted service is highly desirable and therefore, it is also desirable to be able to "hot plug" peripheral devices and their controller cards, that is, plug them in and take them out without turning off the power to the computer system. This is sometimes referred to as "concurrent maintenance." Since such computer systems typically are used to perform critical business functions, for example, the losses in productivity and the resultant economic costs associated with computer system down-time can be significant. Such systems may be serving many users concurrently.

Besides the desire for uninterrupted service, there may be considerable penalties involved with powering-down and powering-up such computer systems to add or replace components. For example, currently running programs must be halted and sometimes large amounts of data saved to non-volatile storage, before the system can be powered down without risking data loss. In mid-range and high-end computer systems, considerable amounts of time and inconvenience may thus be involved in performing unscheduled shutdown and restart operations in an orderly fashion.

In personal computer systems, the above are generally not significant factors to be considered when a new card device is to be added or when an existing card device requires service or replacement. Powering down and restarting a PC does not generally cause the concern it would cause for a user of a mid-range to high-end computer system since, with some exceptions, these are relatively quick and simple operations. Providing uninterrupted customer service even when a system is being upgraded or components repaired is highly desirable and may even be essential for commercial viability in mid-range to high-end systems due to the factors mentioned above. However, this is generally not a major concern with a typical desk-top PC since the PC is not typically performing as critical a business function.

Therefore, in order to take advantage of the multitude of circuit cards, e.g., PCI cards, designed for personal computers, in a mid-range to high-end computer system, without incurring disadvantageous system down-time, a need has existed for a way to safely hot-plug PCI card devices in a mid-range to high-end computer system, avoiding the danger of contact with powered-up adjacent cards or components, for example. That is, a need has existed for a protection mechanism to prevent adjacent PCI cards from touching during hot-plug concurrent maintenance operations.

Although typically the factors making hot-pluggability highly desirable in mid-range to high-end computer systems are not as relevant to PCs, there may be a number of exceptions. In recent years, desktop personal computers have become more and more powerful, and have even been adapted to operate as network servers, and the like, for small businesses. In such a role, there are the same kind of penalties for down time as with mid-range to high-end computer systems.

One solution to minimize the possibility of an accidental electrical contact between cards is to provide non-conductive card separators such as are provided in the Compaq 7000, for example.

However, insertion of PCI cards also requires alignment of the card edge connector with the slot connector into which it is to be plugged, as well as alignment of the "tailstock bracket" on the rear of the card with the system frame or "cage" to which it is to be secured. Simple non-conducting card dividers do not provide any autodocking functionality.

One way of providing for autodocking of component cards involves using an autodocking assembly and method such as that described and disclosed in co-pending application Ser. No. 09/045,934, filed Mar. 23, 1998, "AUTODOCKING ASSEMBLY AND METHOD" (Docket No. R0998-009IBM-1 12). However, there may be situations where such an assembly and method is not suitable, and/or where a less expensive, less complicated solution may be desirable.

Other autodocking solutions have also been proposed, within the International Business Machines Corporation, referred to here as "above the card solutions." However, PCI cards, and the like, sometimes not only have bottom edge connectors for mating with corresponding PCI motherboard/backplane slots, but also have top edge connectors for connections to other components. These above the card solutions did not accommodate these top edge connectors.

These other autodocking solutions are described in co-pending application Ser. No. 08/764,963, Filed Dec. 13, 1996, "SYSTEM AND METHOD FOR INSERTING CIRCUIT BOARDS IN TIGHT SPACES" (Docket P0996-102); and Ser. No. 08/766,566, Filed Dec. 13, 1996, "CABINET FOR INSERTION OF CIRCUIT BOARDS IN TIGHT SPACES" (Docket P0996-109).

It is also noted that these prior above the card solutions used a number of component parts, complicating assembly and manufacturing, and that these solutions generally would not work with a variety of types of cards.

The above described autodocking solutions do not provide for a separator or divider fixed in position between card devices.

Therefore, a need exists for a separator or divider which provides a simple inexpensive solution to the problem of protecting against accidental touching of adjacent cards during a hot-plugging concurrent maintenance operation.

It should be mentioned that besides the preventing of accidental contact with adjacent cards or component, in order to achieve hot-plugging, there are other engineering issues involved in hot-plugging. For example, it may be necessary or desirable to place unused slots in a quiescent powered-down state until a card device is plugged therein. This serves to avoid transients, for example, which may occur as the electrical connection is made between the slot and card edge contacts. Since no two metal contact surfaces are perfect, when they are mechanically brought together, there may initially occur what is commonly called "bounce," i.e., a momentary making and breaking of electrical connection, until the contact surfaces are securely aligned. Such bounce can result in electrical noise which could be misinterpreted as data or control signals, for example. Further, some electronic components may not tolerate the power spikes which could result from this bounce. One solution to these problems is described in Ser. No. 08/878, 025, filed Jun. 18, 1997, "PERIPHERAL COMPONENT INTERCONNECT (PCI) ARCHITECTURE HAVING HOTPLUGGING CAPABILITY FOR A DATA-PROCESSING SYSTEM" (Docket R09-97-028). Here, the bus slot is kept quiescent until it is detected that a card device is seated therein, at which point power can be safely applied to the slot connector and associated card device.

Therefore, it should be understood that additional engineering issues beyond those considered herein may need to be addressed in order to hot-plug card devices.

SUMMARY OF THE INVENTION

It is, therefore, a principle object of this invention to provide a method and apparatus for enabling hot-plugging of PCI circuit cards.

It is another object of the invention to provide a method and apparatus that solves the above mentioned problems so that a PCI circuit card is prevented from coming in contact with an adjacent card, or other component, during hot-plugging.

These and other objects of the present invention are accomplished by the method and apparatus disclosed herein.

According to an aspect of the invention, a divider for preventing a card device from contacting another card device or other electrical component includes a planar member, and locating and securing features which serve to locate the planar member with respect to a card connector, a card planer board, and to locate and secure a card device with respect to the divider.

According to another aspect of the invention, the locating and securing features include snap-fit features permitting easy installation and removal of the divider.

According to another aspect of the invention, by virtue of the snap-fit features described above, the divider can be advantageously removed for special card applications that require component height from the surface of a PCI card beyond the PCI standard.

According to another aspect of the invention, the divider includes features to support a card guide retainer bracket located at the rear of full size PCI cards.

According to another aspect of the invention, a pivot point provided by the divider facilitates insertion and removal where access space is limited.

According to another aspect of the invention, the divider serves to guide a PCI card during insertion.

These and other aspects of the invention will become apparent from the detailed description set forth below.

BRIEF DESCRIPTION OF THE DRAWINGS

FIG. 2A illustrates one detail of the divider of FIG. 2

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
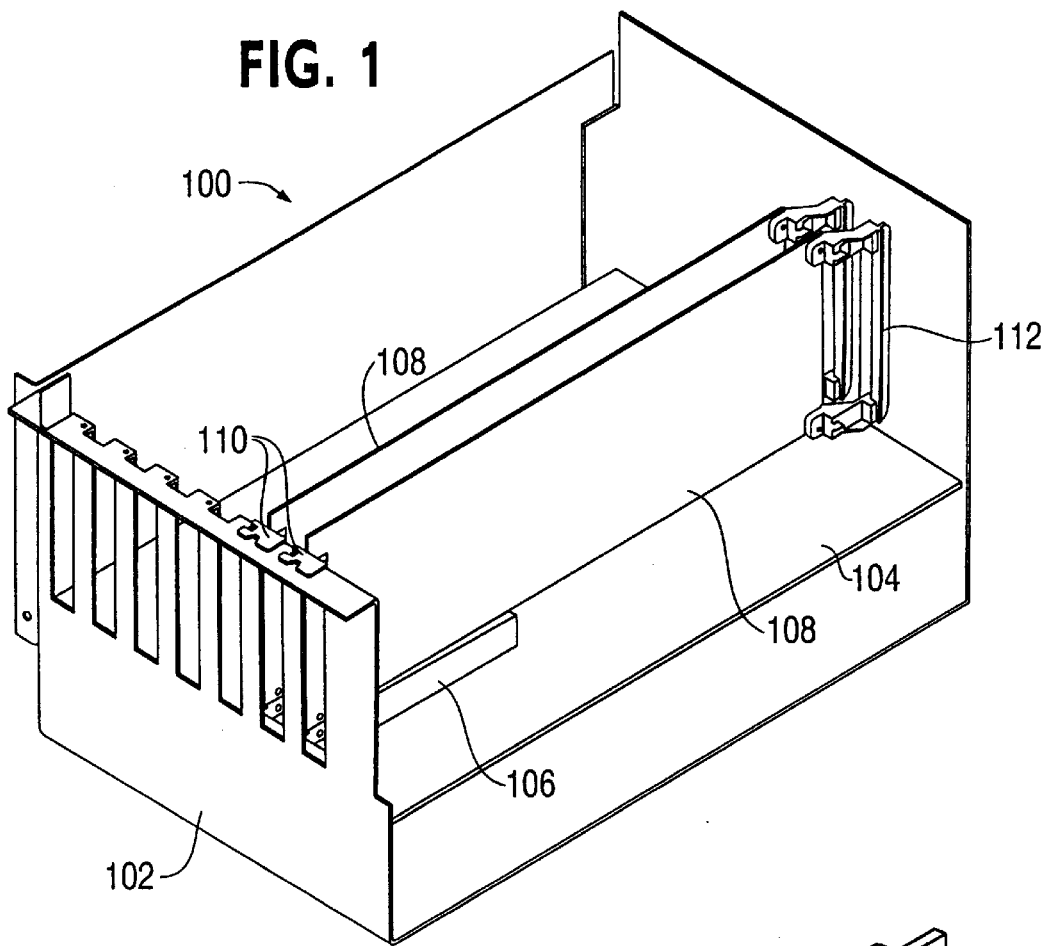
FIG. 1 illustrates a typical PCI card assembly into which the divider according to an exemplary embodiment of the present invention can be installed.

FIG. 1 shows a typical PCI card system 100 without card dividers. A PCI cage 102 which surrounds the other components is illustrated, although the cage 102 may also be a drawer that slides into a frame or rack of a computer system (not shown).

Inside the cage 102 is a PCI planer board 104 having a number of PCI slot connectors 106 for receiving edge connectors of the full-length PCI cards 108. Although shown using PCI slot connectors 106 and PCI cards 108, the invention is not limited to only PCI-type connectors and card devices, such details being used for the purposes of explanation. At one end of a PCI card 108 is provided a tailstock 110 which is essentially a bracket used to guide and secure the PCI card 108 to the cage 102. At an opposite end of the PCI card 108 is a PCI card rear guide retainer bracket 112, which is used on so-called full-sized or full-length PCI cards. Other sizes of PCI cards are known, for example, half-length PCI cards. Such smaller cards would not extend the full length of the PCI cards 108 shown in the figure, and would not be provided with the card rear guide retainer brackets 112.

The convention is for the electronic components to be disposed on one side of a PCI card 108, in particular, the side visible in the figure. Printed circuit wiring, and possibly other electronic components, would be disposed on the surface of the side of the PCI cards 108 not visible, extending a small distance beyond that surface of the cards 108.

As can be seen, adjacent PCI cards 108 are relatively close together. Contact of components on one PCI card 108 with wiring, or components, on an adjacent PCI card 108, is to be avoided when the cards are powered-up since damage to the electronic components could result otherwise. For this reason, PCI cards 108 have not been "hot-plugged" until recently. As mentioned at the outset, hot-plugging refers to inserting or removing a component while the system is "hot," i.e., powered-up. Such operations fall under the category of concurrent maintenance since they are performed while the computer system is running (concurrently).

Figure 2:
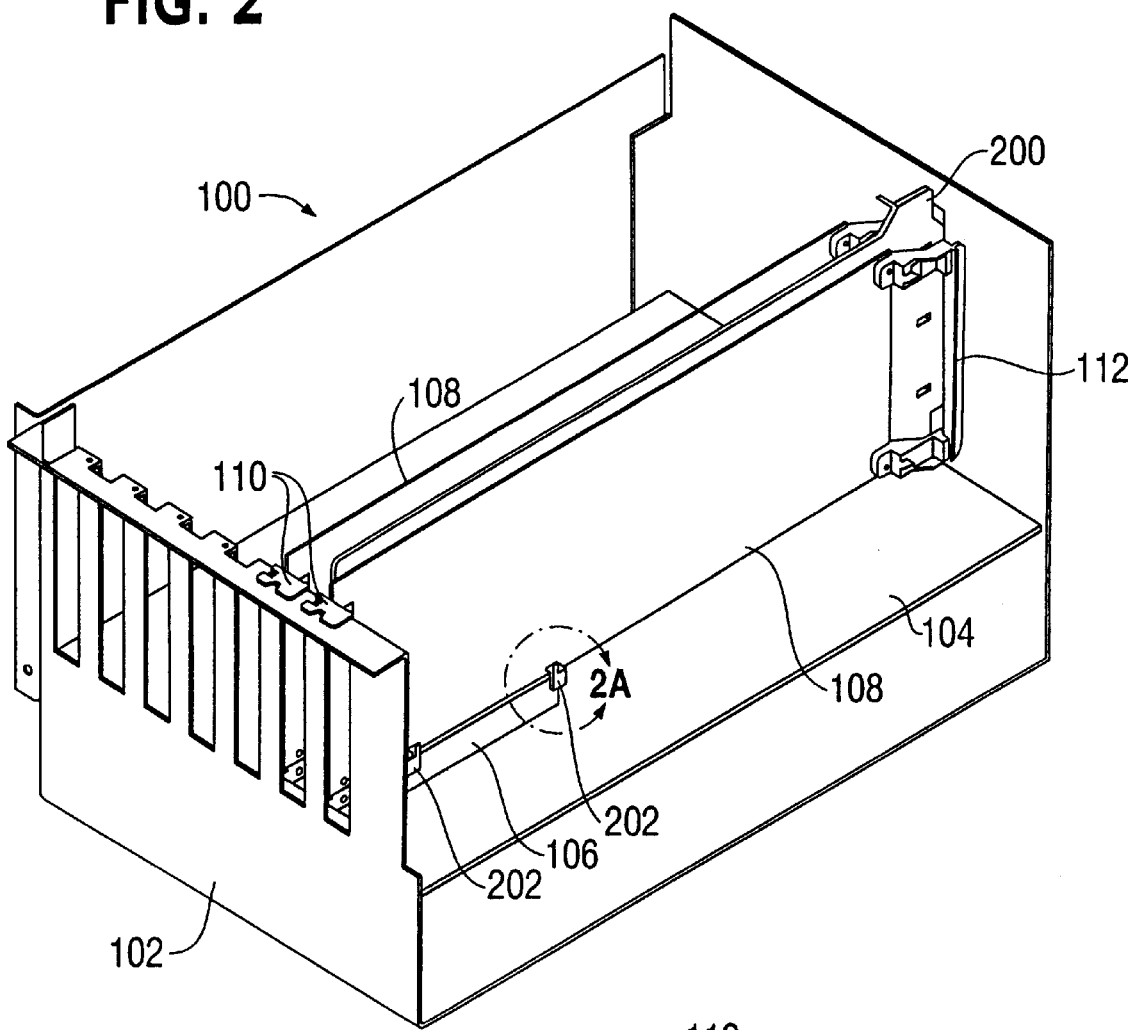
FIG. 2 illustrates the PCI assembly of FIG. 1 having a divider according to an exemplary embodiment of the invention installed.

FIG. 2 shows the same PCI system of FIG. 1, however, with a card divider 200 according to an exemplary embodiment of the present invention installed between adjacent PCI cards 108. As is apparent, the card divider 200 extends the full length of the PCI cards 108 and provides a barrier between the cards 108 so that they cannot touch during a hot-plugging, concurrent maintenance, operation.

The divider card 200 would be made of a rigid, electrically non-conducting material, such as plastic resin, and be approximately 2 mm thick. The divider 200 could also be made of a composite material or a laminate of several materials. If electromagnetic and/or electrostatic shielding of the cards 108 is desirable, the divider 200 could be made of a metal substrate with a non-conducting plastic laminate covering the metal, for example.

If heat dissipation is an issue, the divider 200 could be provided with cooling holes at strategic locations to avoid PCI card component damage due to excessive heat build-up. However, these through-holes would have to be sized and placed so as not to defeat the object of the invention of preventing accidental contact between cards during hot-plugging concurrent maintenance.

A divider 200 would be placed between each adjacent PCI card 108 in a PCI card array. Although the divider 200 is made from an electrically non-conductive material to accomplish the goal of avoiding accidental electrical contact between cards 108, it may be desirable and advantageous to use a non-conducting material with the ability to drain electrostatic charges.

Since plastic structures which are subject to the flow of cooling gases, for example, may become charged with static electricity, it is known to incorporate a carbon-based material therein. This does not convert the plastic material into a conductor, however, such is adequate to permit these static charges to be drained away preventing the possibility of a potentially harmful sudden discharge of the static electricity. Such materials are well known in the art.

In such a case, a ground connection (not shown) to, for example, the PCI cage 102, would provide a path for the static charges to drain to ground.

With reference to FIG. 2A, the detail of FIG. 2 is shown, with the PCI card 108 removed. As can be seen, the divider 200 is designed with connector form-fitting features 202 which locate the divider 200 into the PCI connector 106, either a 32 bit or 64 bit connector, and secure it thereto. The slanted features 204 act as guides to guide and locate the bottom edge of a PCI card 108 to the connector 106 during card insertion into the connector 106. The divider 200 is further designed with features allowing it to snap onto a PCI card assembly planer board 104, as will now be described.

Figure 3:
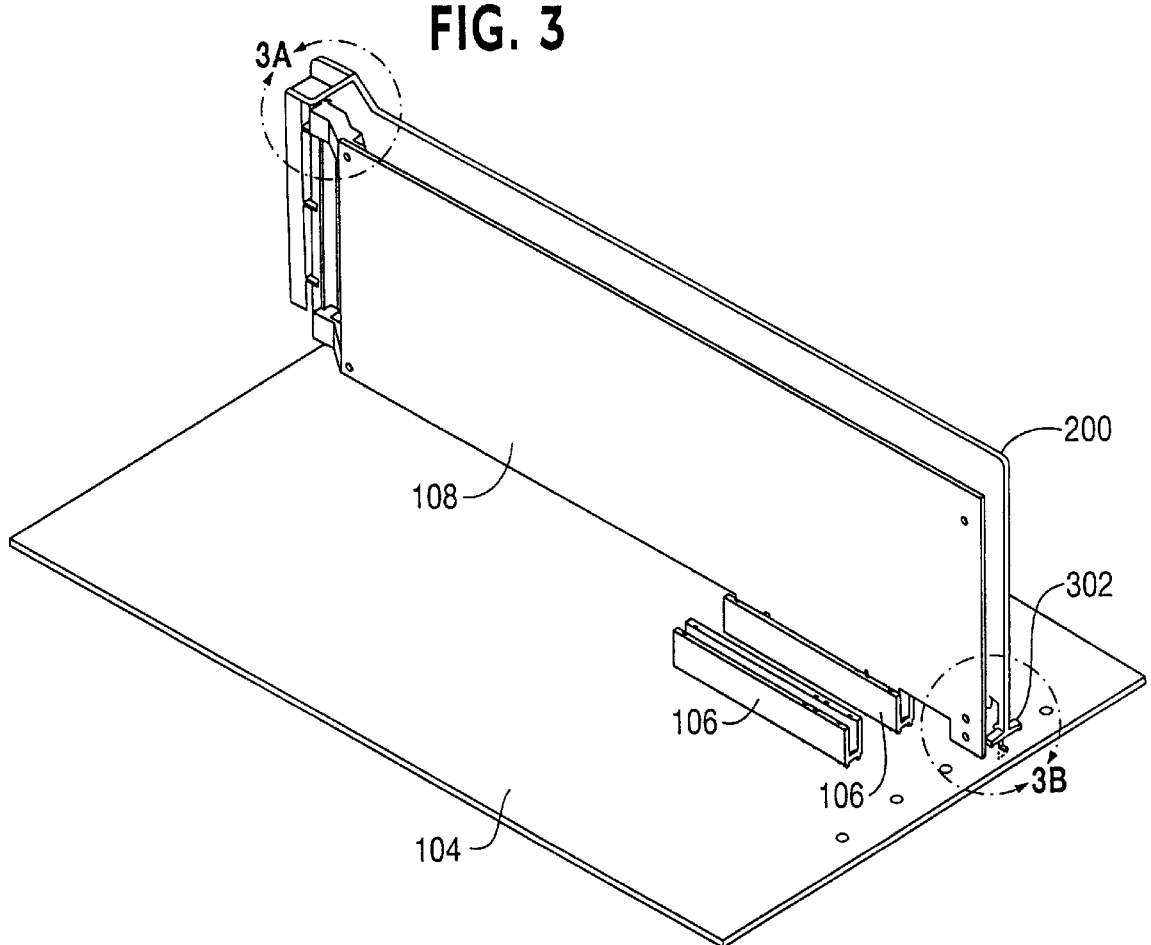
FIG. 3 illustrates an installed divider according to an exemplary embodiment of the invention shown from the opposite side as in FIG. 2.
Figure 3B:
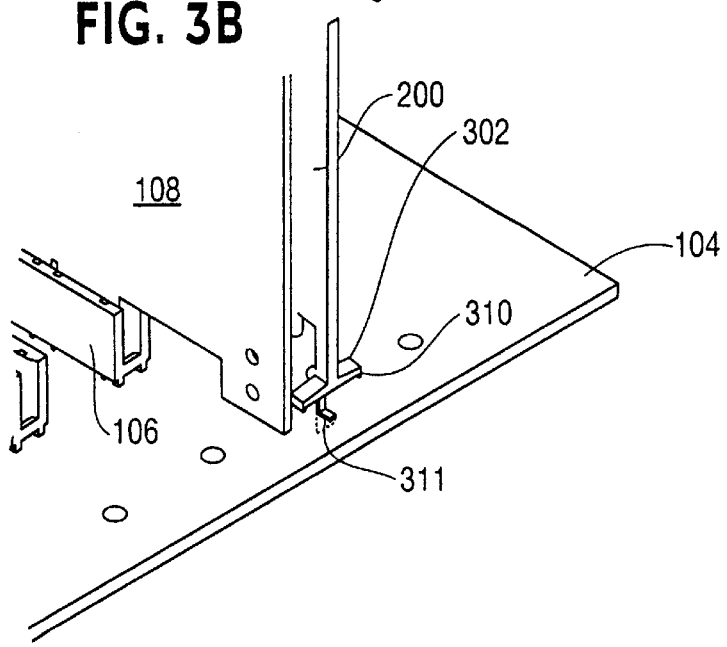
FIG. 3B illustrates a further detail of the divider of FIG. 3.

FIG. 3 shows the other side of a PCI card 108 with a divider 200 and one PCI card 108 installed. The cage 102 has been removed in this view so that details are better seen. Further locating and securing features 302 permit the divider 200 to snap onto the PCI planer board 104 at one end thereof. Features 302, as illustrated in more detail in FIG. 3B, include a hooked extending member 311 which extends, for example, through a hole in the planer board 104, and two horizontal extensions 310 which rest on the top surface of the planer board 104 and limit the distance the hooked extending member can extend through the hole. The hooked member 311 urges the extensions 310 against the surface of the planer board 104 with enough force to secure the divider 200 thereto in a snap-fit configuration. Of course, the invention is not limited to this particular snap-fit locating and securing arrangement, and other ways of locating and securing the divider 200 to the planer board 104 could be used within the spirit and scope of the invention.

As discussed with respect to FIGS. 2 and 2A, the divider 200 also attaches to an adjacent connector with connector form-fitting features 202 (not visible in FIG. 3). Further, the divider 200 is designed to receive and securely connect to the PCI card rear guide retainer bracket 112, as shown in FIG. 3A.

Figure 3A:
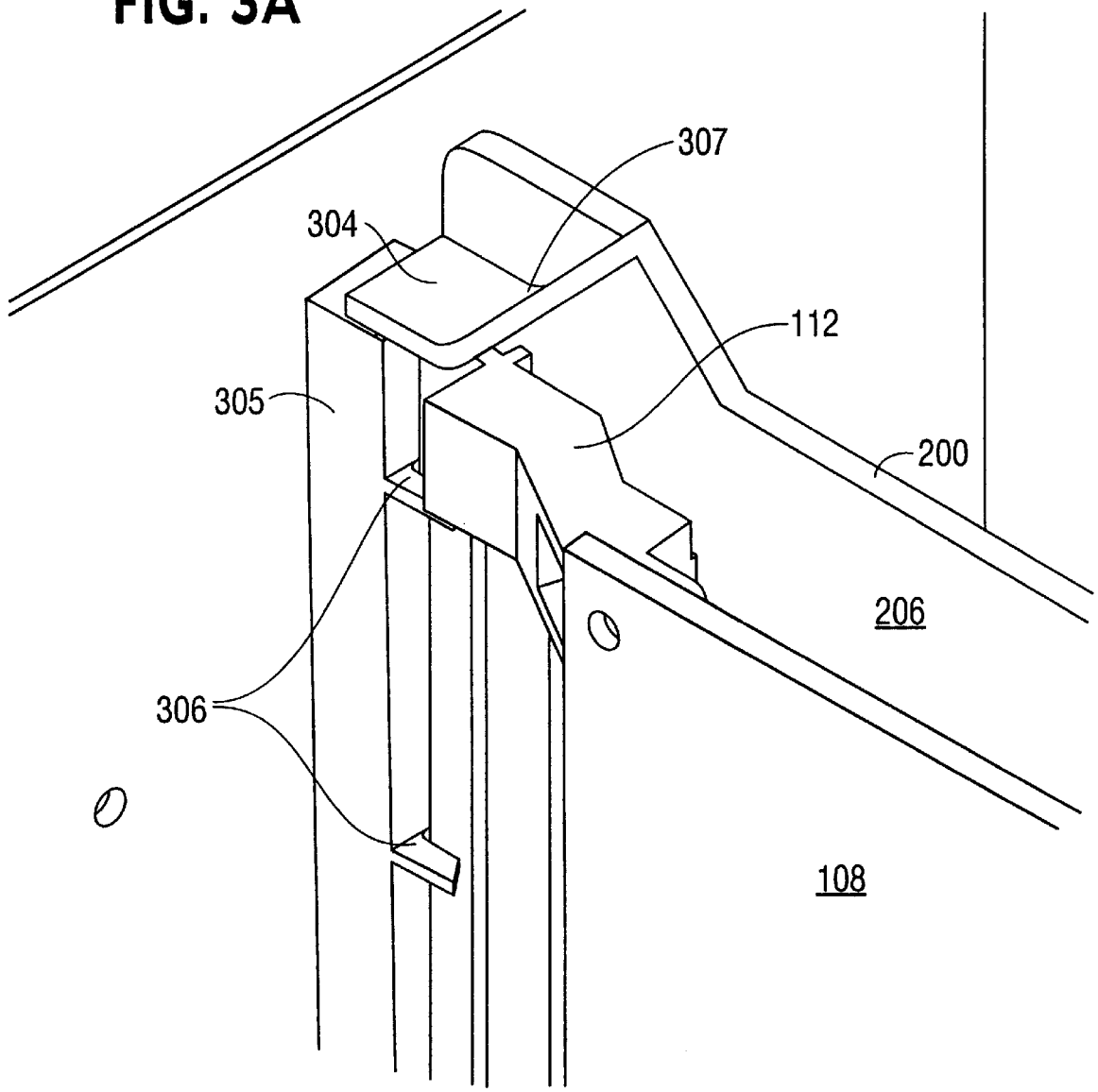
FIG. 3A illustrates a detail of the divider of FIG. 3.

As seen in FIG. 3A, a PCI card 108 has a card rear guide retainer bracket 112 which is located and secured by features 304, 305 and 306. Feature 304 has upper and lower planar surfaces which extend from an end of the divider 200 to an upwardly slanted feature 307, the purpose of which will be described later with reference to FIG. 4. A top end of the card rear guide retainer bracket 112 rests snuggly against the underside, i.e., the lower planar surface, of feature 304 securing the PCI card rear guide retainer bracket 112 thereunder. A stop member includes feature 305 which extends downward from feature 304 essentially parallel to an end surface of the card rear guide retainer bracket 112 stopping, i.e., limiting, the position of the bracket 112, and has extending features 306 and 308 (not visible in this view, see FIG. 4) disposed along its extent which receive and engage the bracket 112. The PCI card rear guide retainer bracket 112 fits between extending features 306 and 308 spaced from an inner surface 206 of the divider 200, the extending features 306 and 308 holding the bracket 112 snuggly and securely in position adjacent to the divider's inner surface 206 and against feature 305. The extending features could be configured to provide a snap-fit if desired within the spirit and scope of the invention.

It should be mentioned that previous PCI assemblies provided a separate part for receiving the PCI card rear guide retainer bracket 112 and such is replaced by these features of the divider card, e.g., features 304, 305 and 306.

As may not be apparent from FIGS. 3 and 3A, the divider 200 attaches to a connector 106, as illustrated in FIGS. 2 and 2A, and attaches to an adjacent PCI card rear guide retainer bracket 112. That is, the divider 200 attaches to the card rear guide retainer bracket 112 of a PCI card 108 which is plugged into a connector 106 adjacent to the connector 106 to which the divider 200 is attached. This is due in part because of the way the PCI card rear guide retainer bracket 112 is configured to extend from a PCI card surface at the end of the PCI card, i.e., in the direction as can be seen in FIG. 3A. The PCI card rear guide retainer bracket 112 extends in the direction of the PCI card 108, and also out and away from the plane of the PCI card component surface by way of the angled portion. This divider arrangement also provides a more stable configuration, as now will be explained.

When it is inserted in a particular slot connector 106, a "first" connector, a PCI card 108 is secured in place by the tight fit of that connector 106. By attaching a divider card 200 for that PCI card 108 to an adjacent connector 106, a "second" connector, additional securing of the PCI card 108 in place is obtained by virtue of its being secured with respect to both the first and the second connectors. Therefore, the divider card so configured may advantageously act like a mechanical stabilizer, adding additional resistance to shock and/or vibration to the PCI assembly, resulting in better reliability of the assembly.

Of course, the invention is not limited to this particular divider attachment arrangement, that is, the connection to the connector 106 could be disposed so that it is on the same side of the divider as the features 304, 305 and 306, which secure the divider 200 to a PCI card rear guide retainer bracket 112. In that case, the divider 200 would be secured to the same connector 106 as the PCI card 108 to which the divider 200 attaches is inserted.

Figure 4:
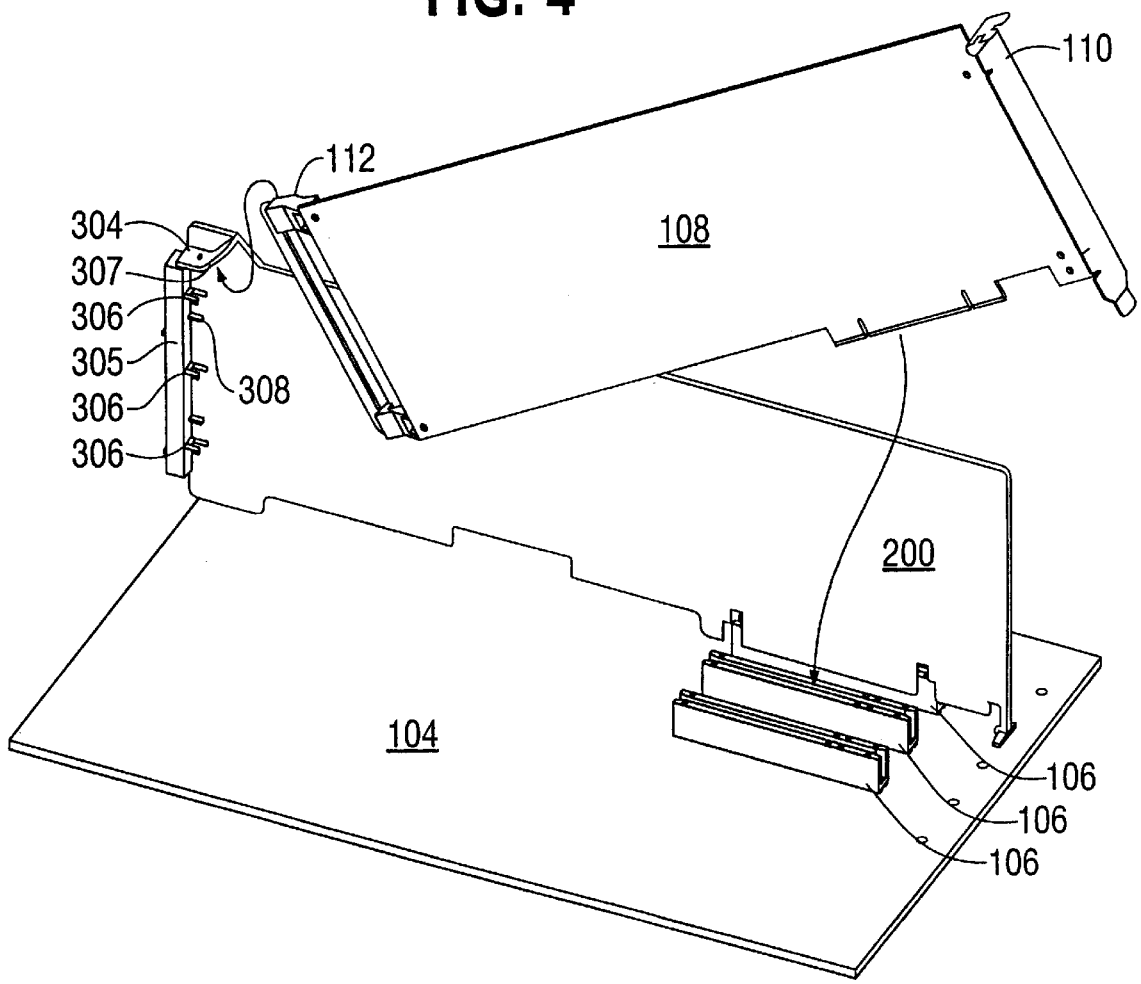
FIG. 4 illustrates insertion of a PCI card using an installed divider according to an exemplary embodiment of the invention.

FIG. 4 illustrates insertion of a PCI card 108 having a card rear guide retainer bracket 112, where a divider 200 is already installed. As can be seen, divider 200 acts as a barrier on the component side of the PCI card 108 being inserted, preventing accidental damage by contact with a PCI card on the other side of the divider 200 during a hot-plugging operation.

As indicated in FIG. 4 and previously described, the top of the PCI card rear guide retainer bracket 112 is placed under feature 304, slanted feature 307 serving to aid this operation. Once aligned thereunder, the PCI board 108 is pivoted and inserted into the connector 106. During this operation, the end of the card rear guide retainer bracket 112 fits into features 306 and 308, holding the bracket 112 against feature 305. Features 308 extend parallel to features 306 and serve to receive and secure the end of the card rear guide retainer bracket 112 therebetween.

The features 304 and 307 are also referred to as a divider tab. Feature 304 acts as a pivot point while the card 108 is inserted into the connector 106. This can be advantageous where access space is limited, such as in a drawer-type PCI assembly application. In a drawer-type PCI assembly, it may be difficult to insert or remove a PCI card by holding it by one hand at either end, since the front of the card where the bracket 112 attaches may not be easily accessible due to limited space for an installer's arm, for example. The divider tab slanted surface 307 and pivot point feature 304 permit installation of the PCI card 108 with one hand by holding the card at the rear end by the flange of the tailstock 110, for example. The slanted surface 307 guides the bracket 112 into position under the divider tab 304 which provides the pivot point.

Figure 5:
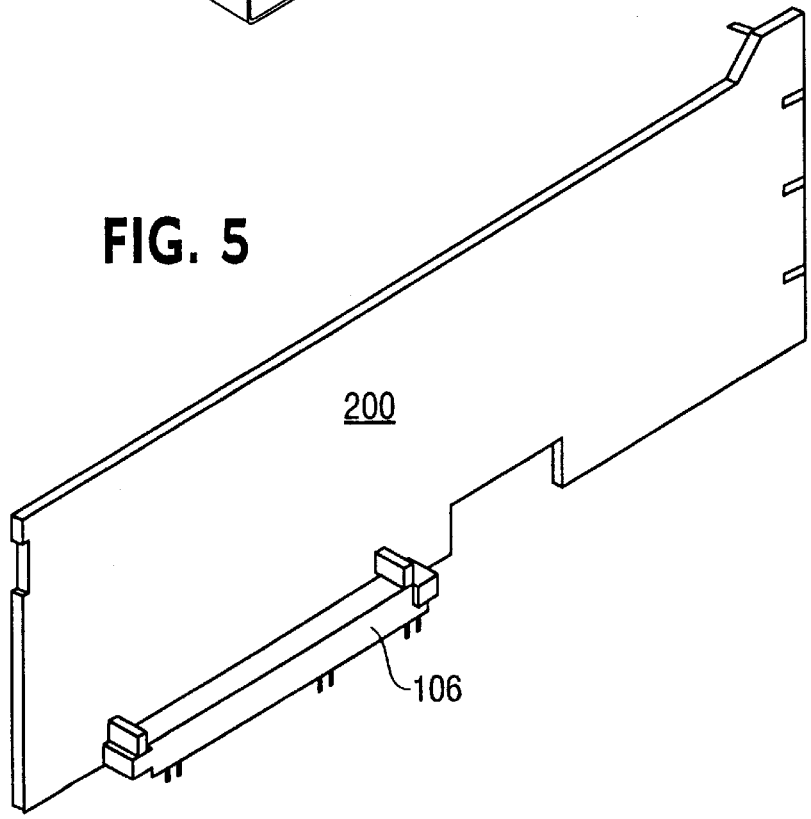
FIG. 5 illustrates a divider according to an exemplary embodiment of the invention attached to a connector.
Figure 6:
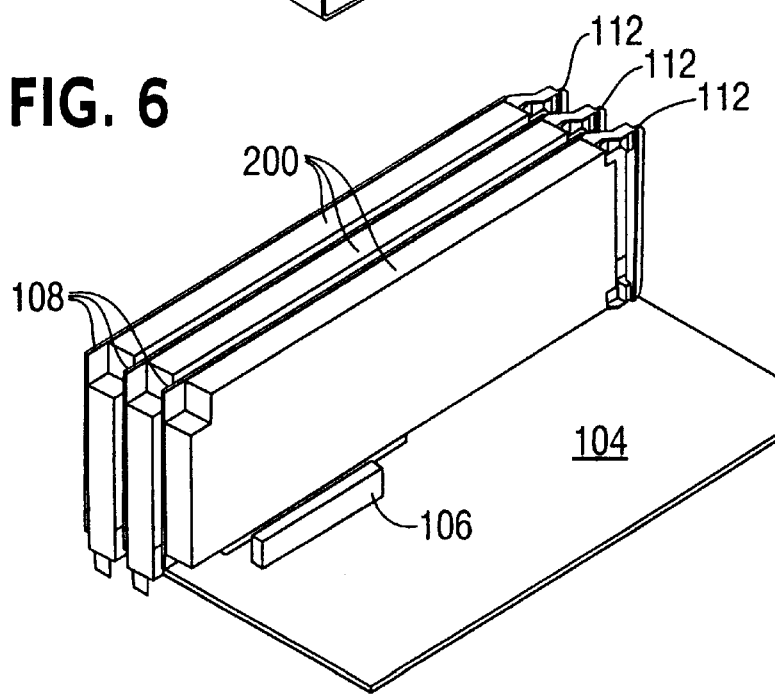
FIG. 6 illustrates three dividers according to an exemplary embodiment of the invention installed in an assembly having three PCI cards.

FIG. 5 shows a single divider 200 installed on a connector 106, and FIG. 6 shows an assembly of three dividers 200 and three PCI cards 108 with card rear guide retainer brackets 112.

Advantageously, by virtue of the snap-fit features described above, the divider 200 can be removed for special card applications that require component height from the surface of a PCI card beyond the PCI standard. Of course in such a situation, the adjacent PCI slot connector into whose space the non-standard component extends, would not normally be used.

In addition to the protective function described above, the divider 200 includes the described features to support a PCI card rear guide retainer bracket 112 which is located at the rear of full size PCI cards 108, and the described features to aid in the guidance of PCI cards 108 as they are inserted into their connectors 106. Where space is limited, such features provide additional advantages in facilitating insertion and removal of the PCI cards.

It will be apparent to one skilled in the art that the manner of making and using the claimed invention has been adequately disclosed in the above-written description of the preferred embodiments taken together with the drawings.

It will be understood that the above described preferred embodiments of the present invention are susceptible to various modifications, changes, and adaptations, and the same are intended to be comprehended within the meaning and range of equivalents of the appended claims.

For example, while described with respect to PCI cards, the invention is not limited to only PCI cards. The disclosed exemplary embodiment could be modified for use with other card types, within the spirit and scope of the invention.

What is claimed is:

1. A divider for preventing a first card device from contacting another card device during insertion and removal of the first card device from a card connector on a planar board, comprising:

a planar member;

first locating and securing means for locating the planar member at the card connector and securing the planar member thereto;

second locating and securing means for locating and securing the planar member with respect to the planer board; and third locating and securing means for locating and securing the first card device with respect to the planar member.

2. The divider according to claim 1, wherein the first locating and securing means comprises at least one card connector form-fitting member.

3. The divider according to claim 2, wherein the at least one card connector form-fitting member fits securely about an end of the card connector.

4. The divider according to claim 3, wherein the first locating and securing means further comprises guide means for guiding the first card device into the card connector during an insertion operation.

5. The divider according to claim 1, wherein the second locating and securing means comprises a first extending member disposed at one end of the divider which mates with the planer board to secure the divider thereto.

6. The divider according to claim 5, wherein the extending member comprises a hooked member which secures the divider to the planer board.

7. The divider according to claim 6, wherein the second locating and securing means further comprises a second extending member which extends substantially perpendicular to the first extending member and substantially parallel to a surface of the planer board, the hooked member forcing the perpendicularly extending member against the surface of the planer board thereby holding the divider securely to the planer board.

8. The divider according to claim 1, wherein the third locating and securing means comprises means for receiving and securing a card rear guide retainer bracket.

9. The divider according to claim 8, wherein the means for receiving and securing the card rear guide retainer bracket comprises a tab member having:

a first surface along which an upper end surface of the card rear guide retainer bracket is guided during insertion or removal of the first card device, and a second surface to which the upper end surface of the card rear guide retainer bracket is guided by the first surface, and against which the upper end surface of the card rear guide retainer bracket pivots during insertion or removal of the first card device.

10. The divider according to claim 9, wherein the means for receiving and securing the card rear guide retainer bracket further comprises a stop member having:

a first portion which extends substantially perpendicular to the tab member second surface and against which an end surface of the card rear guide retainer bracket rests upon insertion of the card device; and a plurality of second portions, extending from the first portion substantially perpendicular thereto, which secure the card rear guide retainer bracket therein.

11. The divider according to claim 1, wherein the first locating and securing means comprises at least one card connector form-fitting member, the at least one card connector form-fitting member fitting securely about an end of the card connector;

wherein the first locating and securing means further comprises guide means for guiding the first card device into a card connector during an insertion operation;

wherein the second locating and securing means comprises a first extending member disposed at one end of the divider which mates with the planer board;

wherein the first extending member comprises a hooked member which secures the divider to the planer board;

wherein the second locating and securing means further comprises a second extending member which extends substantially perpendicular to the first extending member and substantially parallel to a surface of the planer board, the hooked member forcing the perpendicularly extending member against the surface of the planer board thereby holding the divider securely to the planer board; and wherein the third locating and securing means comprises means for receiving and securing a card rear guide retainer bracket, the means for receiving and securing a card rear guide retainer bracket including a tab member and a stop member, the tab member having:

a first surface along which an upper end surface of the card rear guide retainer bracket is guided during insertion or removal of the first card device, and a second surface to which the upper end surface of the card rear guide retainer bracket is guided by the first surface, and against which the upper end surface of the card rear guide retainer bracket pivots during insertion or removal of the first card device; and the stop member having:

a first portion which extends substantially perpendicular to the tab member second surface and against which an end surface of the card rear guide retainer bracket rests upon insertion of the card device; and a plurality of second portions, extending from the first portion substantially perpendicular thereto, which secure the card rear guide retainer bracket therein.

12. A method of hot-plugging a card device comprising utilizing the divider according to claim 1.

13. The method according to claim 12, wherein the card device comprises a full-length peripheral component interconnect card.

14. An assembly comprising the planer board having a plurality of card connectors thereon and a plurality of the dividers according to claim 1.

15. An assembly comprising the planer board having a plurality of card connectors thereon and a plurality of the dividers according to claim 11.

16. The assembly according to claim 15, further comprising a card assembly housing in which the planer board is disposed.

17. The assembly according to claim 16, further comprising at least one card device inserted in a card connector of the planer board.

18. A method of installing a first card device having a rear guide retainer bracket, in a card assembly having a planer board with at least one card connector, and having at least one divider for preventing the first card device from contacting another card device during insertion and/or removal of the first card device from a card connector on the planer board, the method comprising:

inserting the rear guide retainer bracket in a locating and securing portion of the at least one divider; and pivoting the first card device about the locating and securing portion of the at least one divider until an edge connector of the first card device is fully coupled into the card connector.

19. The method according to claim 18, wherein the inserting comprises:

placing an upper end surface of the rear guide retainer bracket against a first surface of the locating and securing portion; and guiding the upper end surface of the rear guide retainer bracket along the first surface of the locating and securing portion to a second surface of the locating and securing portion about which the upper end surface of the card rear guide retainer bracket can pivot.

20. The method according to claim 19, wherein the pivoting comprises pivoting the upper end surface of the rear guide retainer bracket about the second surface;

wherein the method further comprises securing the rear guide retainer bracket in the securing portion of the divider.

21. A divider comprising:

a substantially rectangular planar body;

card attaching means for attaching the divider to a card device; and board attaching means for attaching the planar body to a connector board.

22. The divider according to claim 21, wherein the board attaching means comprises:

a first member extending from the planar body configured to have a portion which is insertable into and removable from the connector board and to provide a snap-fit therewith.

23. The divider according to claim 22, wherein the board attaching means further comprises:

a second member extending from the planar body configured to form-fit with a connector of the connector board.

24. The divider according to claim 23, wherein the first member portion which is insertable comprises a hook which is sized and shaped so as to be insertable into a hole on a connector board and latch thereto when the planar body is oriented substantially perpendicular to the connector board; and wherein the first member includes a second portion which extends substantially perpendicular to the portion which is insertable, the second portion extending substantially parallel to the connector board when the planar body is oriented substantially perpendicular to the connector board.

25. The divider according to claim 24, wherein the card attaching means comprises:

a third member extending from the planar body configured to form-fit with the card device.

26. The divider according to claim 21, wherein the card attaching means comprises:

a member extending from the planar body configured to form-fit with the card device.

27. A card device assembly having a planer board with a plurality of connectors thereon, at least some of the connectors having a respective card device inserted therein, and a plurality of dividers according to claim 21, disposed between respective card devices.

* * * * *